United States Patent
Tunali et al.

(10) Patent No.: US 10,484,012 B1
(45) Date of Patent: Nov. 19, 2019

(54) SYSTEMS AND METHODS FOR DECODING QUASI-CYCLIC (QC) LOW-DENSITY PARITY-CHECK (LDPC) CODES

(71) Applicant: Xilinx, Inc., San Jose, CA (US)

(72) Inventors: Nihat E. Tunali, Campbell, CA (US); Richard L. Walke, Edinburgh (GB); Christopher H. Dick, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/688,628

(22) Filed: Aug. 28, 2017

(51) Int. Cl.
  *H03M 13/11* (2006.01)
(52) U.S. Cl.
  CPC .... *H03M 13/1162* (2013.01); *H03M 13/1111* (2013.01); *H03M 13/1125* (2013.01); *H03M 13/1137* (2013.01); *H03M 13/116* (2013.01); *H03M 13/118* (2013.01); *H03M 13/1117* (2013.01)
(58) Field of Classification Search
  CPC .......... H03M 13/1162; H03M 13/1111; H03M 13/1125; H03M 13/118; H03M 13/116; H03M 13/1117; H03M 13/1137
  USPC .......................................................... 714/758
  See application file for complete search history.

(56) References Cited

U.S. PATENT DOCUMENTS

| | | | | |
|---|---|---|---|---|
| 8,291,283 B1 * | 10/2012 | Rad | ...................... | H03M 13/036 714/752 |
| 8,429,483 B1 * | 4/2013 | Varnica | ................ | G06F 11/1048 714/752 |
| 8,438,459 B2 * | 5/2013 | Cho | .................... | H03M 13/1114 714/758 |
| 8,489,957 B2 * | 7/2013 | Wesel | ................ | H03M 13/1111 714/752 |
| 8,612,835 B2 * | 12/2013 | Yokokawa | ......... | H03M 13/1137 714/758 |
| 8,713,397 B2 * | 4/2014 | Yang | .................... | H03M 13/114 714/752 |
| 8,984,376 B1 * | 3/2015 | Norrie | ................ | H03M 13/1142 714/772 |

(Continued)

OTHER PUBLICATIONS

Mansour, Mohammad M., "A Turbo-Decoding Message-Passing Algorithm for Sparse Parity-Check Matrix Codes", IEEE Transactions on Signal Processing, Nov. 2006, pp. 4376-4392, vol. 54, No. 11, IEEE, Piscataway, New Jersey, USA.

(Continued)

*Primary Examiner* — James C Kerveros
(74) *Attorney, Agent, or Firm* — David O'Brien; Keith Taboada

(57) ABSTRACT

A decoder circuit includes an input configured to receive an encoded message generated based on a QC-LDPC code. A first layer process unit is configured to process a first layer of a parity check matrix to generate a plurality of log-likelihood ratio (LLR) values corresponding to a plurality of variable nodes associated with the encoded message respectively. The first layer process unit includes a plurality of row process units configured to process a first plurality of rows of the first layer in parallel to generate a plurality of row update values. A layer update unit is configured to generate a first LLR value for a first variable node using first and second row update values for the first variable node. An output is configured to provide a decoded message generated based the plurality of LLR values.

20 Claims, 13 Drawing Sheets

(56) References Cited

U.S. PATENT DOCUMENTS

| | | | |
|---|---|---|---|
| 9,413,390 B1 | 8/2016 | Yin et al. | |
| 2008/0077843 A1* | 3/2008 | Cho | H03M 13/1114 |
| | | | 714/801 |
| 2013/0061112 A1* | 3/2013 | Chen | H03M 13/114 |
| | | | 714/758 |
| 2013/0139023 A1* | 5/2013 | Han | G11B 20/1833 |
| | | | 714/752 |
| 2014/0101510 A1* | 4/2014 | Wang | H03M 13/09 |
| | | | 714/758 |
| 2014/0181612 A1* | 6/2014 | Gunnam | H03M 13/1177 |
| | | | 714/752 |
| 2015/0227419 A1* | 8/2015 | Sakaue | G11C 29/52 |
| | | | 714/764 |
| 2016/0055057 A1* | 2/2016 | Shin | G06F 11/1012 |
| | | | 714/764 |

OTHER PUBLICATIONS

Emran, Ahmed A. et al. "Simplified Variable-Scaled Min Sum LDPC Decoder for Irregular LDPC Codes," Proc. of the 2014 IEEE 11th Consumer Communication and Netwiorking Conference, Jan. 10, 2014, pp. 518-523, IEEE, Piscataway, New Jersey, USA.

\* cited by examiner

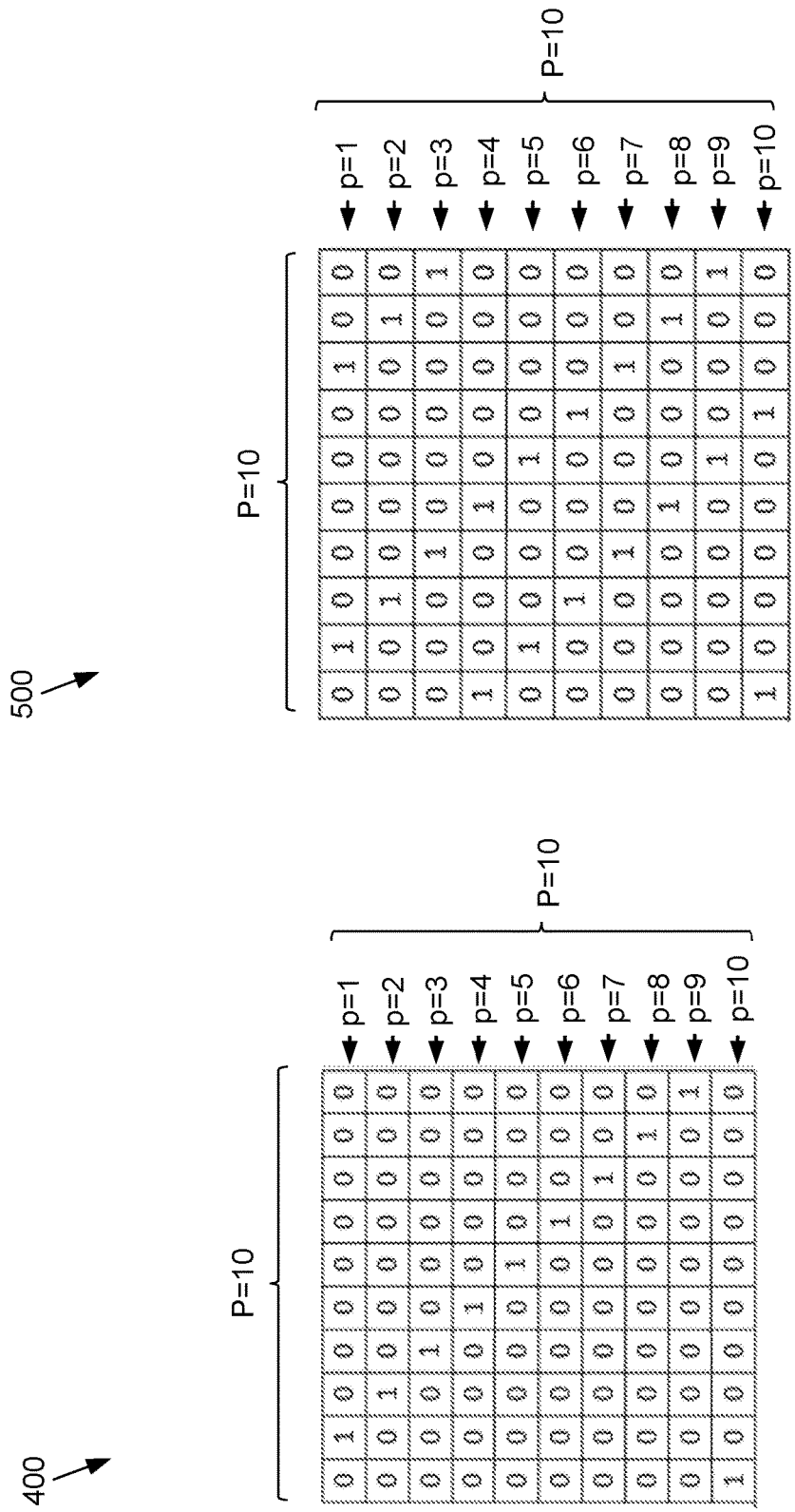

650 →

```
1   for b = 1:B
2       for p = 1:P
3           for l = 1:L_b
```
$$v_{l,p}^b = v_{l,p}^b - upd\_vnode_{l,p}^b$$
```
5           end
6           for l = 1:L_b
```
$$upd\_vnode_{l,p}^b = \alpha \min(|V_{l,p}^b|) \Pi sign(V_{l,p}^b)$$
```
8           end
9           for l = 1:L_b
```
$$v_{l,p}^b = v_{l,p}^b + upd\_vnode_{l,p}^b$$
```
11          end
12      end
13  end
```

FIG. 7A

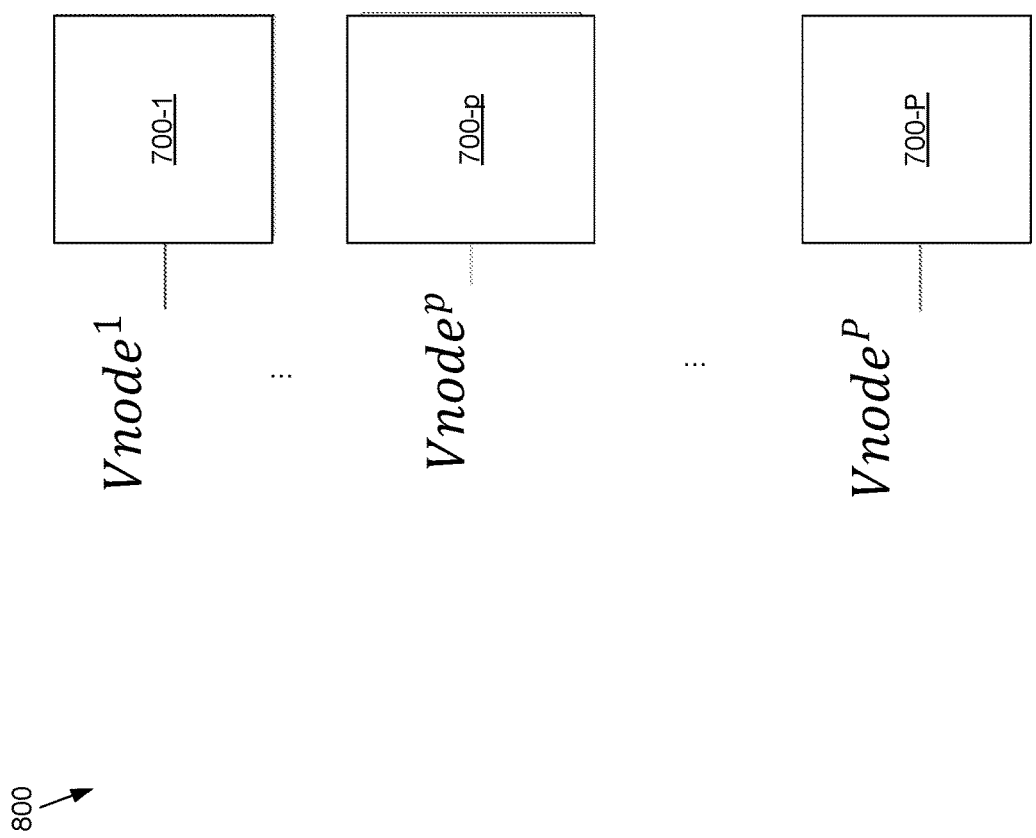

```
1   for b = 1:B
2     for p = 1:P
3       for l = 1:L_b
4         if w(vnode_{l,p}^b) == 1
5           v_{l,p}^b = v_{l,p}^b - layer_upd_vnode_{l,p}^b
6         else
7           v_{l,p}^b = f(v_{l,p}^b) - layer_upd(f(vnode_{l,p}^b))
8         end
9       for l = 1:L_b
10        row_upd_vnode_{l,p}^b = α min(|V_{l,p}^b|) Π sign(V_{l,p}^b)
11      end
12      for l = 1:L_b
13        if w(vnode_{l,p}^b) == 1
14          layer_upd_vnode_{l,p}^b = row_upd_vnode_{l,p}^b
15          v_{l,p}^b = v_{l,p}^b + layer_upd_vnode_{l,p}^b
16        else
17          store row_upd_vnode_{l,p}^b
18        end
19      end
20      for ∀ vnode_b' ∈ Vnode_b'
          layer_upd_vnode_b'
21                         = ∑_{∀vnode_{l,p}^b such that f(vnode_{l,p}^b)=v_b'} row_upd_vnode_{l,p}^b 22        v_b' = v_b' + layer_upd_vnode_b'
23      end
24    end
```

FIG. 9

SYSTEMS AND METHODS FOR DECODING QUASI-CYCLIC (QC) LOW-DENSITY PARITY-CHECK (LDPC) CODES

TECHNICAL FIELD

Examples of the present disclosure generally relate to integrated circuits ("ICs") and, in particular, to an embodiment related to decoding low-density parity-check (LDPC) codes.

BACKGROUND

Low-density parity-check (LDPC) codes are a class of error-correcting codes that may be efficiently encoded and decoded in hardware. LDPC codes are linear codes that have sparse parity-check matrices. The sparseness of the parity-check matrices allows for computationally inexpensive error correction. In some embodiments, quasi-cyclic (QC) LDPC codes may be used to generate longer codewords and yield more efficient hardware parallelization. However, the conventional methods for decoding QC-LDPC codes may provide insufficient decoding throughput, which may lead to degraded application performance and a lower data transmission rate.

Accordingly, it would be desirable and useful to provide an improved way of decoding QC-LDPC codes.

SUMMARY

In some embodiments in accordance with the present disclosure, a decoder circuit includes an input configured to receive an encoded message generated based on a QC-LDPC code, and a first layer process unit configured to process a first layer of a parity check matrix to generate a plurality of log-likelihood ratio (LLR) values for a plurality of variable nodes associated with the encoded message. The first layer includes a first plurality of rows of the parity check matrix. The first layer process unit includes a plurality of row process units configured to process the first plurality of rows in parallel to generate a plurality of row update values for the plurality of variable nodes. A layer update unit is configured to generate a first LLR value for a first variable node using first and second row update values for the first variable node. An output is configured to provide a decoded message generated based the plurality of LLR values.

In some embodiments, the parity check matrix is constructed by expanding elements of a base matrix using a plurality of submatrices respectively, wherein a first element of a first row of the base matrix corresponds to a first submatrix having a circulant weight greater than one.

In some embodiments, the first layer corresponds to the first row of the base matrix.

In some embodiments, the first layer process unit further includes a storage element configured to store the first row update value and the second row update value, and wherein the layer update unit is configured to retrieve, from the storage element, the first and second row update values for generating the first LLR value.

In some embodiments, a first row process unit of the plurality of row process units includes a first sub-row process unit configured to receive the first row update value corresponding to the first variable node; and determine that the first variable node is updated two or more times in the first plurality of rows and in response, send the first row update value to the storage element.

In some embodiments, the first row process unit of the plurality of row process units includes: a second sub-row process unit configured to receive a third row update value corresponding to a second variable node; and determine that the second variable node is updated once in the first plurality of rows and in response, generate a second LLR value for the second variable node using the third row update value.

In some embodiments, the first row process unit of the plurality of row process units is configured to send a third row update value corresponding to a second variable node to the storage element, wherein the second variable node is updated once in the first plurality of rows, and wherein the layer update unit is configured to retrieve, from the storage element, the third row update value and generate a second LLR value for the second variable node using the third row update value.

In some embodiments, the first layer process unit is configured to after processing the first layer of the parity check matrix, processing a second layer of the parity check matrix adjacent to the first layer to update the variable nodes, wherein the plurality of row process units of the first layer process unit are configured to process a second plurality of rows corresponding to the second layer in parallel to generate a second plurality of row update values for the variable nodes.

In some embodiments, each row process unit is configured to generate the first plurality of row update values using a belief propagation algorithm.

In some embodiments, the belief propagation algorithm is an algorithm selected from the group consisting of a sum-product algorithm, a min-sum algorithm, a scaled min-sum algorithm, and a variable scaled min-sum algorithm.

In some embodiments in accordance with the present disclosure, a method includes receiving an encoded message generated based on a QC-LDPC code; and processing a first layer of a parity check matrix to generate a plurality of LLR values for a plurality of variable nodes associated with the encoded message. The first layer includes a first plurality of rows of the parity check matrix. The processing the first layer includes processing, by a plurality of row process units, the first plurality of rows in parallel, to generate a first plurality of row update values for the plurality of variable nodes; and generating, by a layer update unit, a first LLR value for a first variable node using a first row update value corresponding to a first row and a second row update value corresponding to a second row. The method further includes generating a decoded message based the variable nodes.

In some embodiments, the processing the first layer further includes: storing, in a storage element, the first row update value and the second row update value; and retrieving, by the layer update unit from the storage element, the first and second row update values for generating the first LLR value.

In some embodiments, the processing the first layer further includes: generating, by the first row process unit of the plurality of row process units, the first row update value corresponding to the first variable node; determining, by the first row process unit, that the first variable node is updated two or more times in the first plurality of rows; and storing, in the storage element, the first row update value.

In some embodiments, the processing the first layer further includes: generating, by the first row process unit, a third row update value corresponding to a second variable node, wherein the second variable node is updated once in the first plurality of rows; and generating, by the first row process unit, a second LLR value for the second variable node using the third row update value.

In some embodiments, the processing the first layer further includes: generating, by the first row process unit, a third row update value corresponding to a second variable node, wherein the second variable node is updated once in the first plurality of rows; storing, in the storage element, the third row update value; retrieving, by the layer update unit from the storage element, the third row update value; and generating, by the layer update unit, a second LLR value for the second variable node using the third row update value.

In some embodiments, the method further comprises after processing the first layer of the parity check matrix, processing a second layer of the parity check matrix adjacent to the first layer to update the variable nodes, wherein a second plurality of rows corresponding to the second layer are processed in parallel to generate a second plurality of row update values for the plurality of variable nodes.

Other aspects and features will be evident from reading the following detailed description and accompanying drawings.

BRIEF DESCRIPTION OF THE DRAWINGS

FIG. 4 illustrates an exemplary circulant submatrix having a circulant weight of one according to some embodiments of the present disclosure.

FIG. 5 illustrates an exemplary circulant submatrix having a circulant weight of two according to some embodiments of the present disclosure.

FIG. 7A illustrates a portion of an exemplary layered decoding method according to some embodiments of the present disclosure.

FIG. 8 illustrates an exemplary layer process unit according to some embodiments of the present disclosure.

FIG. 9 illustrates a portion of an exemplary layered decoding method according to some embodiments of the present disclosure.

DETAILED DESCRIPTION

Figure 1:
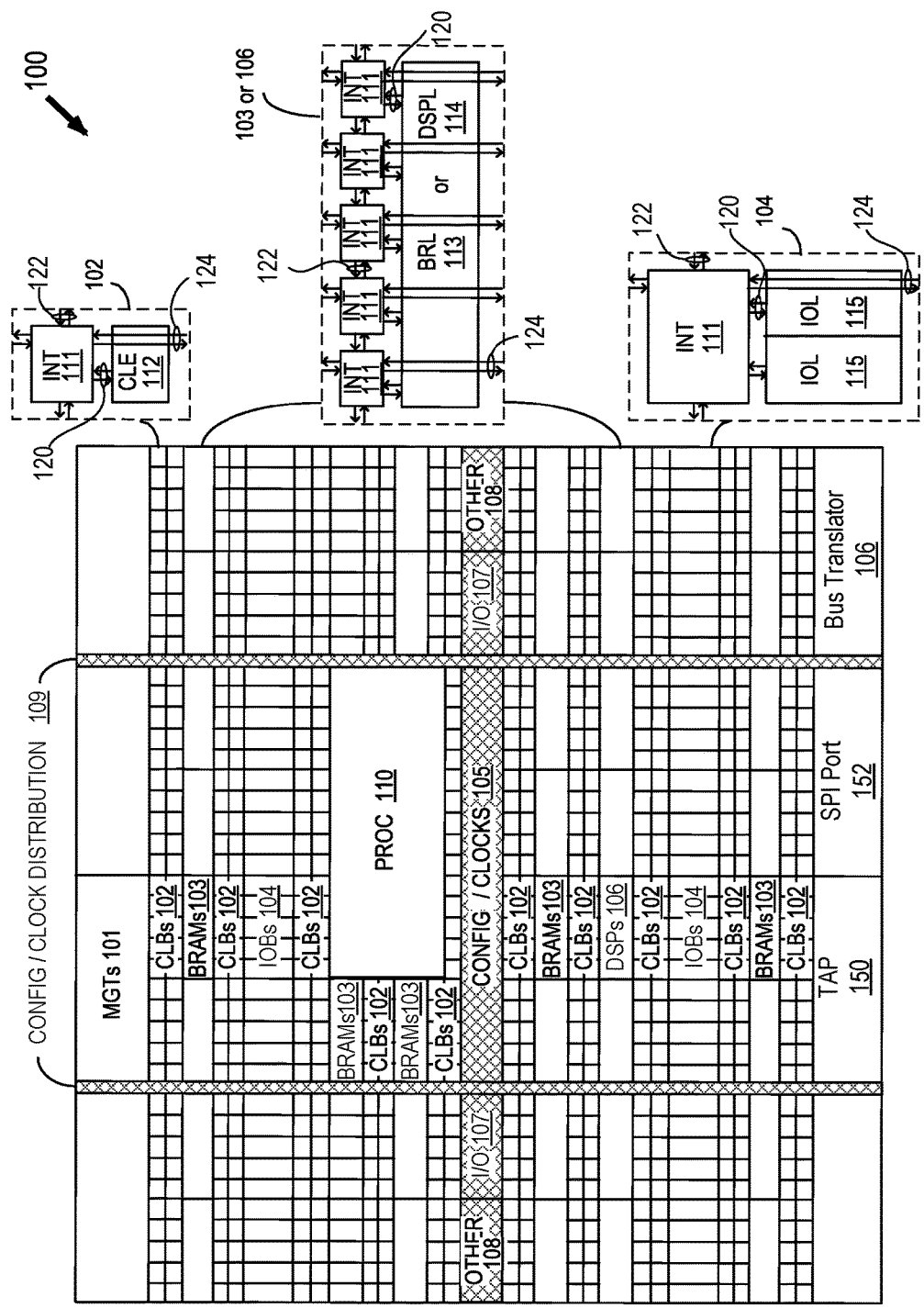
FIG. 1 is a block diagram illustrating an exemplary architecture for an IC according to some embodiments of the present disclosure.

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

Before describing exemplary embodiments illustratively depicted in the several figures, a general introduction is provided to further understanding. LDPC codes are widely used in many communication standards. In some embodiments, LDPC codes may use quasi-cyclic parity check matrices for improved bit error rate. Those codes may be referred to as quasi-cyclic low-density parity check (QC-LDPC) codes. A parity check matrix for QC-LDPC codes may be represented using a base matrix and expansion submatrices for expanding the elements of the base matrix. In various embodiments, a layered decoder may use a layered approach for decoding QC-LDPC codes by updating soft bit information from layer to layer of the parity check matrix. Each layer corresponds to a row of the base matrix, and includes a plurality rows corresponding to the expansion submatrix. In the discussion below, the expansion submatrix may also be referred to as submatrix. In some embodiments, QC-LDPC codes have a parity check matrix including submatrices that are either an all zero matrix or a circulant matrix having a circulant weight equal to or greater than one. In an example, the circulant matrix has a circulant weight equal to one, and each row and column of the circulant matrix has a single one non-zero element. In that example, in the layered decoder, the plurality of rows of a particular layer may be processed simultaneously in parallel. However, in some embodiments, QC-LDPC codes may include a parity check matrix including submatrices that have a circulant weight great than one. In those embodiments, parallel processing of the rows of a particular layer may not be implemented because of data dependencies between those rows. For integrated circuit (IC) solutions, it has been discovered that by storing row update values for variable nodes having a weight greater than one in each layer, parallel row processing for a particular layer may be achieved even for QC-LDPC codes having a parity check matrix with submatrices with a circulant weight greater than one. A decoder implementing such parallelism improves throughput and reduces latency without performance degradation.

With the above general understanding borne in mind, various embodiments for decoding QC-LDPC codes are described below.

Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or complex programmable logic devices (CPLDs). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

In general, each of these programmable logic devices ("PLDs"), the functionality of the device is controlled by configuration data provided to the device for that purpose. The configuration data can be stored in volatile memory (e.g., static memory cells, as common in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an exemplary FPGA architecture 100. The FPGA architecture 100 includes a large number of different programmable tiles, including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the example of FIG. 1, an area (depicted horizontally) near the center of the die (e.g., formed of regions 105, 107, and 108 shown in FIG. 1) can be used for configuration, clock, and other control logic. Column 109 (depicted vertically) extending from this horizontal area or other columns may be used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, PROC 110 spans several columns of CLBs and BRAMs. PROC 110 can include various components ranging from a single microprocessor to a complete programmable processing system of microprocessor(s), memory controllers, peripherals, and the like.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100, and may be replaced with one or more of the other varieties of the programmable blocks described. Further, such blocks can be utilized to form a "soft processor" in that the various blocks of programmable circuitry can be used to form a processor that can execute program code, as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 can be considered programmable circuitry of the IC.

In some embodiments, the functionality and connectivity of programmable circuitry are not established until configuration data is loaded into the IC. A set of configuration data can be used to program programmable circuitry of an IC such as an FPGA. The configuration data is, in some cases, referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

In some embodiments, circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC, more than one adjacent row of CLBs is typically included wherever the CLBs appear, to facilitate the efficient implementation of user logic, but the number of adjacent CLB rows varies with the overall size of the IC. Moreover, the FPGA of FIG. 1 illustrates one example of a programmable IC that can employ examples of the interconnect circuits described herein. The interconnect circuits described herein can be used in other types of programmable ICs, such as CPLDs or any type of programmable IC having a programmable interconnect structure for selectively coupling logic elements.

It is noted that the IC that may implement the decoder is not limited to the exemplary IC depicted in FIG. 1, and that IC having other configurations, or other types of IC, may also implement the decoder.

Figure 2:
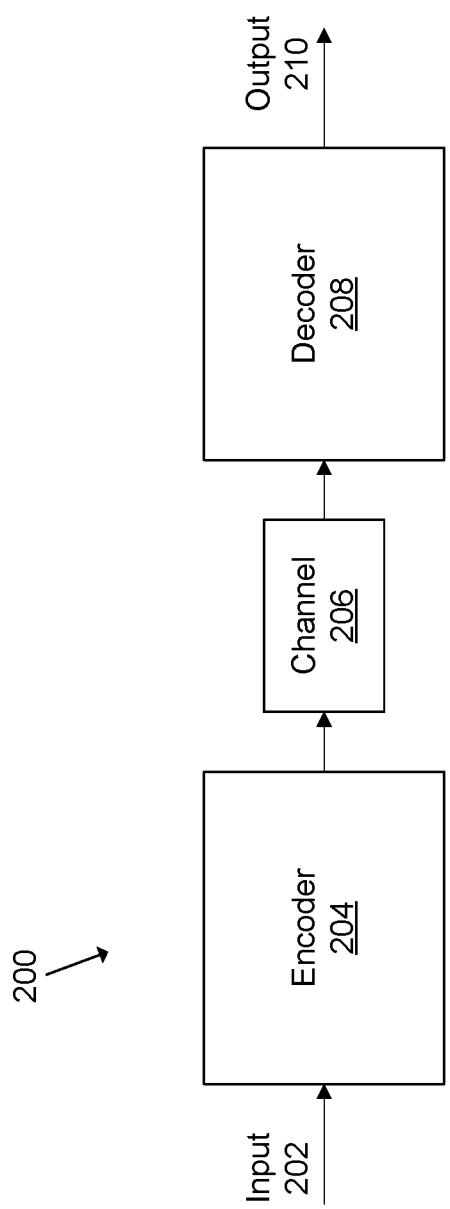
FIG. 2 is a block diagram illustrating an exemplary encoding and/or decoding system according to some embodiments of the present disclosure.

FIG. 2 illustrates an example of an encoding and/or decoding system 200 in which QC-LDPC codes may be implemented. There, an input 202 may comprise message data that is input into an encoder 204. The encoder 204 may use a parity check matrix to encode the message data so that error correction may be performed after transmission. After the message data is encoded, it may be sent over communication channel(s) 206 (e.g., one or more network channels) to the decoder 208. The decoder 208 receives the transmitted encoded message data (also referred to as a received codeword), uses a parity check matrix on the received message data to decode the encoded message data, and provides a decoded message data as an output 210. If errors in the encoded message data, such as bit-flips, occur during transmission over the communication channel(s) 206, the decoder 208 may detect and fix the error using QC-LDPC error correction algorithm.

Figure 3:
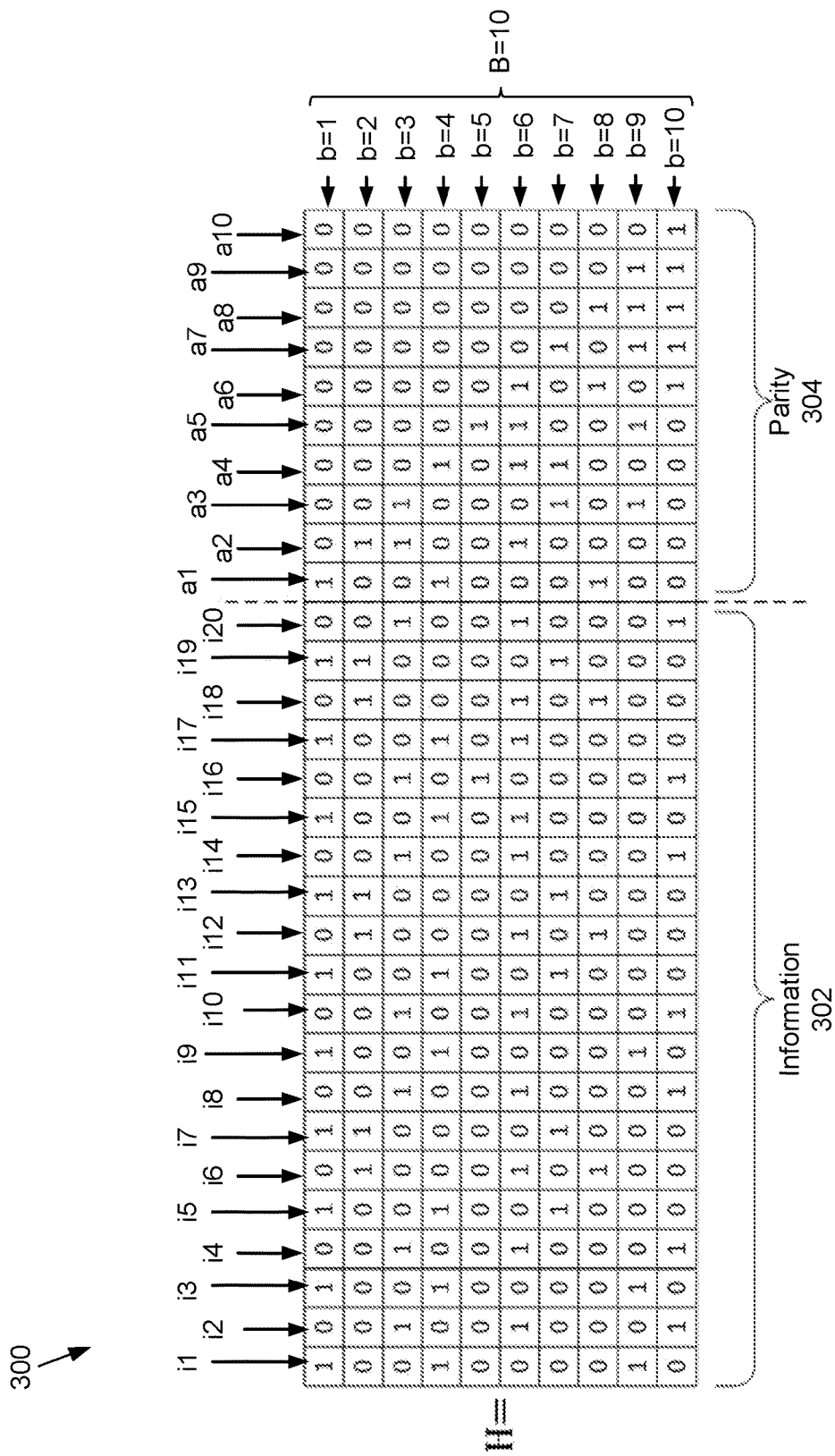
FIG. 3 illustrates an exemplary parity check matrix of an LDPC code according to some embodiments of the present disclosure.
Figure 6:
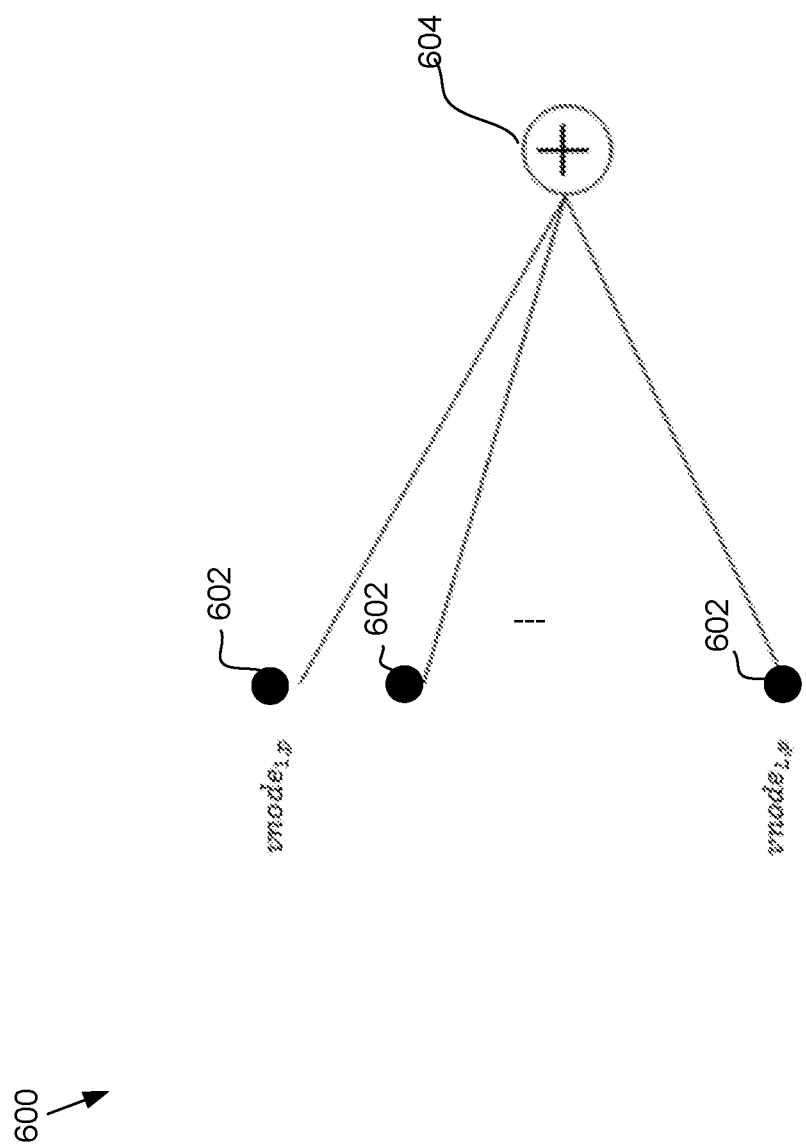
FIG. 6 illustrates an exemplary bipartite graph for a row of a parity check matrix according to some embodiments of the present disclosure.

FIG. 3 illustrates an example of a parity check matrix 300 of an LDPC code. The parity check matrix 300 includes an information part 302 and a parity part 304. The information part 302 of the parity check matrix 300 includes information bits (e.g., information bits i1 through i20 for each row). The parity part 304 of the parity check matrix 300 includes parity bits (e.g., parity bits a1 through a10 for each row). In the example of FIG. 3, the LDPC code may encode the 20 information bits to 30 codeword bits by appending 10 parity bits to the information bits. In an example, a decoder 208 may determine that a codeword c is a valid codeword if the syndrome condition $Hc^T=0$ is satisfied, where H is the decoding parity check matrix.

In some embodiments, a parity check matrix H of a QC-LDPC code may be constructed by expanding the parity check matrix 300 using submatrices. The parity check matrix 300 may be referred to as a base matrix $H_B$. In the description below, the matrix 300 of FIG. 3 is used as a base matrix $H_B$ for a parity check matrix H, and is referred to as the base matrix 300, Each row of the base matrix $H_B$ may be referred to as a layer having a layer index b. In the example of FIG. 3, the base matrix $H_B$ has B (e.g., B=10) layers.

Referring to FIGS. 4 and 5, in various embodiments, a parity check matrix H of a QC-LDPC code may be constructed by expanding the elements of the base matrix $H_B$ using expansion submatrices. Circulant matrices with different circulant weights may be used as the expansion submatrices. Illustrated in FIG. 4 is a submatrix 400 having a circulant weight of one has one non-zero element in each row and each column. In some QC-LDPC codes (e.g., 802.11 WIFI codes), submatrices used to expand each element of the base matrix 300 is either an all zero matrix (e.g., for an element of the base matrix 300 having a value of 0) or a circulant matrix (e.g., a circulant matrix 400) having a circulant weight of one (e.g., for an element having a value of 1).

Illustrated in FIG. 5 is a submatrix 500 having a circulant weight of two, which has two non-zero elements in each row and each column. In some QC-LDPC codes (e.g., DVBS-2 codes), submatrices used to expand the elements of the base matrix 300 may be an all zero matrix (e.g., to expand an element of the base matrix 300 having a value of 0) or a circulant matrix (e.g., a circulant matrix 500) having a circulant weight of two or more (e.g., to expand an element of the base matrix 300 having a value of 1).

Referring to FIGS. 6, 7A, 7B, and 8, in some embodiments, a layered decoding algorithm may be used by the decoder 208. A bipartite graph (also referred to as Tanner graph) 600 of FIG. 6 describes a row of a parity check matrix H. In the bipartite graph 600, vnode$_{l,p}$ denotes the $l^{th}$ variable node that participates in the $p^{th}$ row of the parity check matrix H. The bipartite graph 600 includes variable nodes 602 denoted as vnode$_{1,p}$ through vnode$_{L,p}$, where L is the total number of non-zero bits in the $p^{th}$ row of the parity check matrix H. In an example using the base matrix 300 of FIG. 3, there are 11 bits that participate in the parity equation of the first row of H, thus L=11. The variable nodes 602 connect to a check node 604, which corresponding to the parity check equation of the $p^{th}$ row, which may be provided as $h_p c^T = 0$, where $h_p$ is the $p^{th}$ row of the parity check matrix H.

Referring to FIG. 7A, illustrated is a layered decoding process 650 that performs decoding by processing layers of the parity check matrix H. Each $b^{th}$ layer contains the rows P*(b−1)+1 to P*b in the parity check matrix H. Each $b^{th}$ layer has a row weight $L_b$. In the layered decoding process 650, H denotes the parity check matrix. N denotes its codeword length, K denotes its information bit length, and N-K denotes the number of parity bits. P denotes the circulant submatrix size. B denotes the number of layers in the parity check matrix. In an example, B may be computed as (N-K)/P. $v_{l,p}^b$ denotes the log-likelihood ratio (LLR) of the $l^{th}$ variable node vnode$_{l,p}^b$ in the $p^{th}$ row of the $b^{th}$ layer of the parity check matrix. $V_{l,p}^b$ denotes a set of cardinality $L_b$ which contains the LLRs of all the variable nodes Vnode$_{l,p}^b$ that participate in the $p^{th}$ row of the $b^{th}$ layer of the parity check matrix. $V_{l,p}^b$ may be expressed as $V_{l,p}^b = V_{l,p} \setminus v_{l,p}^b$, i.e. LLRs of all variable nodes that participate in the $p^{th}$ row of the $b^{th}$ layer of the parity check matrix H excluding $v_{l,p}^b$. upd_vnode$_{l,p}^b$ denotes the update (e.g., the check-node to variable node messages) to the variable node vnode$_{l,p}^b$ in the $p^{th}$ row of the $b^{th}$ layer of the parity check matrix H.

In various embodiments, a variable node update rule of the layered decoding algorithm may use a belief propagation algorithm. A belief propagation algorithm may include, for example, a sum-product algorithm, a min-sum algorithm, a scaled min-sum algorithm, a variable scaled min-sum algorithm, and any other suitable belief propagation algorithms. While the descriptions below uses a scaled min-sum algorithm, it is exemplary only and not intended to be limiting beyond what is specifically recited in the claims that follow. The variable node update rule of the layered decoding algorithm 650 performs lines 2 through 12 of FIG. 7A for each $b^{th}$ layer by processing the P consecutive rows corresponding to that $b^{th}$ layer.

Figure 7B:
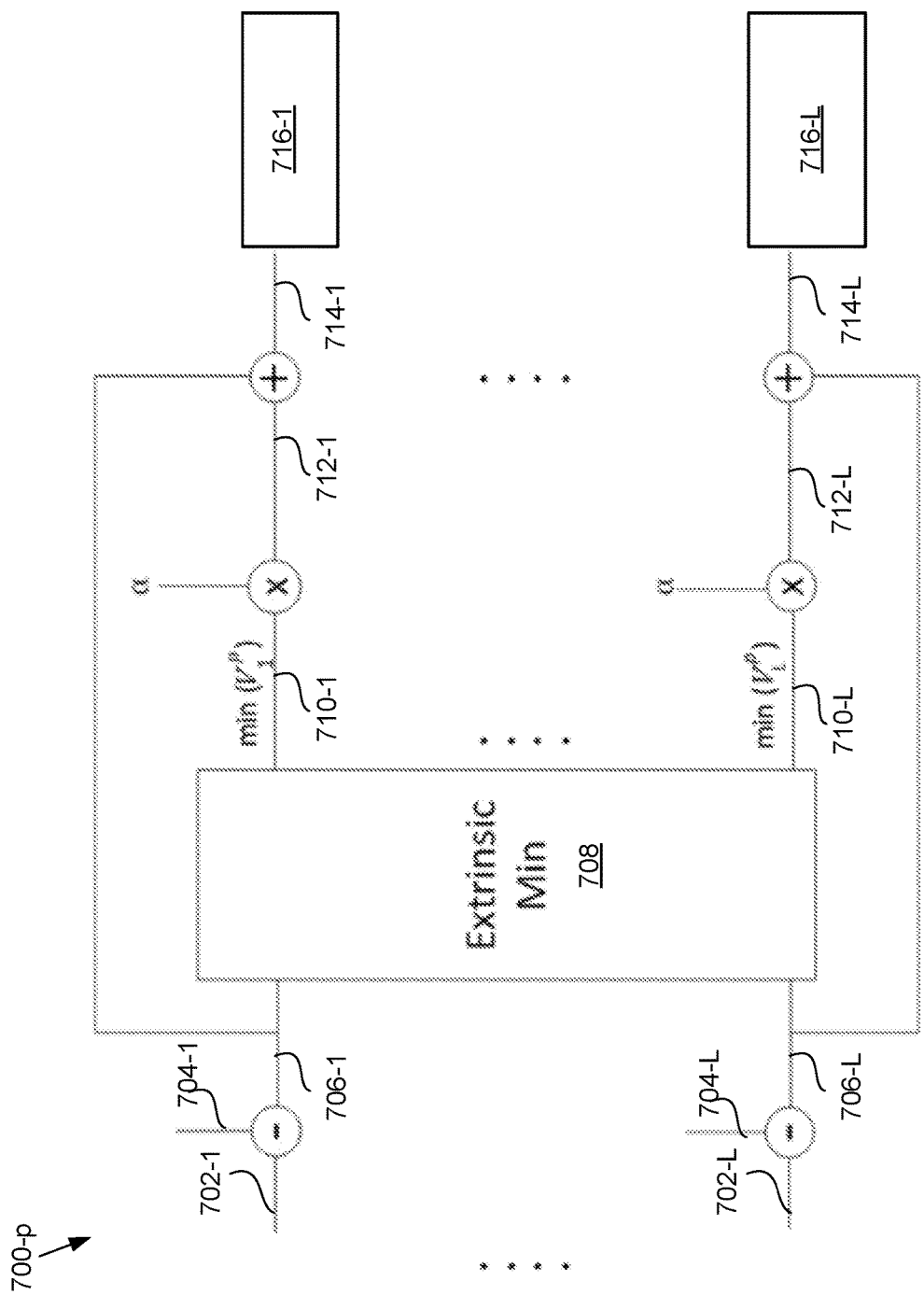
FIG. 7B illustrates an exemplary row process unit according to some embodiments of the present disclosure.

Illustrated in FIG. 7B is an exemplary implementation of a row process unit 700-$p$ for computing lines 3 through 11 of the layered decoding process 650 for the $p^{th}$ row of the of P consecutive rows of a particular $b^{th}$ layer. The row process unit 700-$p$ receives signals 702-1 through 702-L including the log-likelihood ratio (LLR) values (e.g., $v_{l,p}^b$) for vnode$_{l,p}^b$ through vnode$_{L,p}^b$ respectively. In some embodiments, these LLR values $v_{l,p}^b$ are obtained from a previous update. Signals 706-$a$1 through 706-L include first updated LLR values (e.g., $v_{l,p}^b$), which $v_{l,p}^b$ may be generated (e.g., according to line 4 of the layered decoding process 650) by deducting the corresponding check node messages upd_vnode$_{l,p}^b$ in signals 704-1 through 704-L of the previous update.

In some embodiments, signals 706-1 through 706-L including the first updated LLR values (e.g., $v_{l,p}^b$) are sent to an extrinsic information unit 708, which computes the extrinsic minimum values (e.g., by computing min($|V_l^p|$)

$\Pi sign(V_l^p)$ according to line 7 of the layered decoding process 650) for each variable node index l from 1 to $L_b$. As illustrated in FIG. 7B, a scalar a is applied to the extrinsic minimum values in signals 710-1 through 710-L to generate scaled extrinsic minimum values in signals 712-1 through 712-L. Those scaled extrinsic minimum values may also be referred to as check node messages upd_vnode$_{l,p}^b$. Signals 706-1 through 706-L including the first updated LLR values $v_{l,p}^b$ and signals 712-1 through 712-L including check node messages upd_vnode$_{l,p}^b$ used to generate signals 714-1 through 714-L including second updated LLR values $v_{l,p}^b$ as provided by line 10 of the algorithm 650, which is the LLR estimate for the $l^{th}$ variable node vnode$_{l,p}^b$ in the $p^{th}$ row of layer b. Signals 714-1 through 714-L are then sent to blocks 716-1 through 716-L respectively, where the second updated LLR values $v_{l,p}^b$ may be stored in a storage element (e.g., a memory) which may be used in the next update in the layered decoding algorithm.

Referring to FIG. 8, illustrated therein is an exemplary layer processing unit 800 for processing P consecutive rows of a particular layer in parallel where there are no data dependencies between those P consecutive rows. For example, each element of the base matrix $H_B$ corresponds to a submatrix (e.g., a submatrix 400 of FIG. 4 or a submatrix having all zero matrix values) having a circulant weight that is not greater than one. In that example, there are no data dependencies between the variable nodes vnode$_{l,p}$ in the P consecutive rows of a layer. As such, the P consecutive rows of the parity check matrix H corresponding to a particular layer may be processed according to the layer processing algorithm 650 of FIG. 7A in parallel. As illustrated in FIG. 8, the layer processing unit 800 includes row process units 700-1 through 700-P that may process P consecutive rows of a particular layer respectively in parallel. Each row process unit 700-$p$ processes Vnode$^p$ including the corresponding set of variable nodes vnode$_{1,p}$ through vnode$_{L,p}$, and generates corresponding LLR estimates (e.g., according to lines 3-11 of the layered decoding process 650).

However, in some embodiments, the elements of the base matrix $H_B$ may correspond to submatrices (e.g., a submatrix 500 of FIG. 5) having a circulant weight greater than one. In those embodiments, there may be data dependencies between the variable node messages in a particular layer. As such, the layered decoding algorithm of lines 2 through 12 of the algorithm 650 as described above may not be implemented by processing the P rows of that particular layer in parallel as described above with reference to the layer processing unit 800 of FIG. 8.

Referring to FIGS. 9, 10, 11, and 12, methods and systems for decoding QC-LDPC codes that address the challenges for QC-LDPC codes including submatrices having a circulant weight greater than one are described. As described in detail below, by computing row updates for each row and storing the row updates in a storage element, a layer update process may be performed using the stored row updates for variable nodes having a weight greater than one in the P rows. This allows the row updates to be performed in parallel. As such, the P rows of the same layer may be processed in parallel despite the data dependencies in those P rows.

Referring to FIG. 9, illustrated is pseudo code for a layered decoding process 900 according to some embodiments of the present disclosure. In the layered decoding process 900, w(vnode$_{l,p}^b$) denote the circulant weight of the variable node vnode$_{l,p}^b$ in the corresponding circulant submatrix. Note that for w(vnode$_{l,p}^b$)>1, the same variable node will be updated at least twice within the same layer. We use vnode$_b$'∈Vnode$_b$' to denote variable nodes with circulant weight greater than 1 within the b$^{th}$ layer of the parity check matrix H. As explained in detail below, the layered decoding process 900 keeps track of only the accumulated update to variable nodes with circulant weight greater than 1 in the b$^{th}$ layer. As such, f (vnode$_{l,p}^b$)→v$_b$', is used to denote the many-to-one function that maps LLR updates to variable nodes with circulant weight greater than 1 within a particular b$^{th}$ layer to a single value. The row update row_upd_vnode$_{l,p}^b$ denotes the update to vnode$_{l,p}^b$ for the l$^{th}$ circulant within the p$^{th}$ row of the b$^{th}$ layer, layer_upd_vnode$_b$' denotes the accumulated update to v$_b$' within the b$^{th}$ layer.

In some embodiments, the algorithm 900 scans through P consecutive rows of a particular layer in a loop 902 as provided by lines 2 through 19. In each iteration of the loop 902, the p$^{th}$ row of the P consecutive rows is processed by scanning through the L$_b$ variable nodes in a block 904, which corresponds to lines 3 and 18 of the algorithm 900. In the block 904, the LLR value v$_{l,p}^b$ of variable node vnode$_{l,p}^b$ is updated at lines 5 and 7. At line 10, a check node message (e.g., a scaled min-sum value) row_upd_vnode$_{l,p}^b$ is calculated using a min(|V$_{l,p}^b$|)Πsign(v$_{l,p}^b$). In some embodiments, α is a scaling constant. In other embodiments, α may be a variable. For example, α may have different values for different layers. For further example, the value of α may be determined based the circulant weight of the submatrices corresponding to a particular layer.

As shown in lines 13, 14, and 15 of the algorithm 900, in the case where the weight w(vnode$_{l,p}^b$) is equal to one, the LLR value v$_{l,p}^b$ is directly computed using layer_upd_vnod-O$_{l,p}^b$. At lines 16 and 17, in cases where w(nodev$_{l,p}^b$) is not equal to one, the algorithm 900 may store the row update value row_upd_vnode$_{l,p}^b$ in a storage element (e.g., a memory). As discussed in detail below, storing the row updates row_upd_vnode$_{l,p}^b$ for where w(vnode$_{l,p}^b$) is greater than to one allows the P rows of the b$^{th}$ layer to be processed in parallel, even for submatrices that have a circulant weight greater than one.

After the algorithm 900 completes processing the P rows in the loop 902, at lines 20 to 23, for each variable node vnode$_b$' that has a weight w(vnode$_{l,p}^b$) greater than one, a layer update process may be performed to generate a layer update value using stored row update values row_upd_vnode$_{l,p}^b$ and compute the LLR value using the layer update value layer_upd_vnode$_b$'. In some embodiments, at line 21, for a particular variable node vnode$_b$', a layer update value layer_upd_vnode$_{l,p}^b$ is computed by combining the corresponding stored row updates row_upd_vnode$_{l,p}^b$ where such that f(vnode$_{l,p}^b$)=v$_b$'. In an example, v$_b$' may be updated using both row_upd_vnode$_{l,p1}^b$, and row_upd_vnode$_{l,p2}^b$. At line 22, the LLR value v$_b$' is updated using the layer update value layer_upd_vnode$_b$'.

In various embodiments, the results of the b$^{th}$ layer may be used in processing another layer in the layered decoding process.

Figure 10:
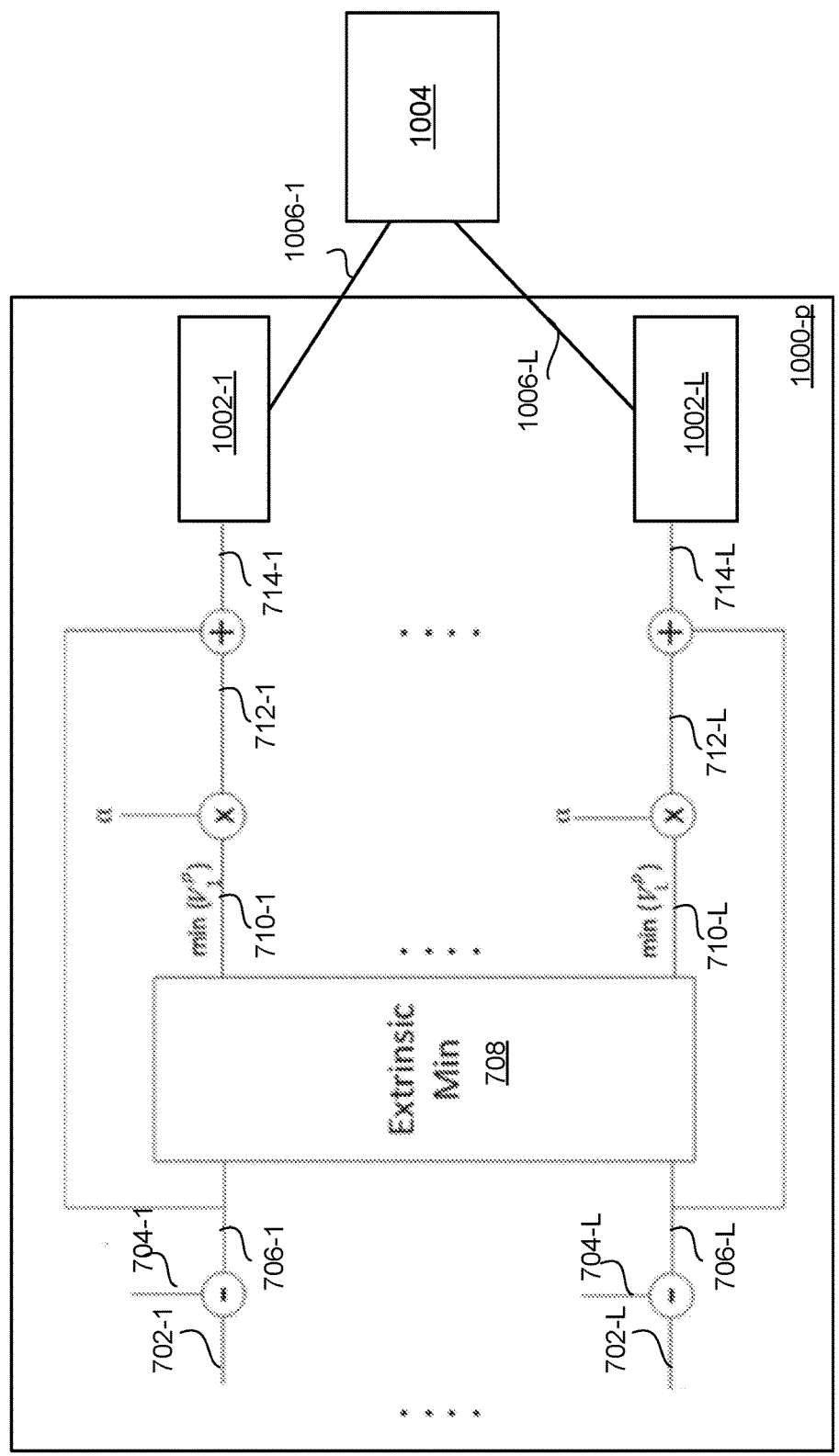
FIG. 10 illustrates another exemplary row process unit according to some embodiments of the present disclosure.

Referring to FIG. 10, illustrated is a diagram of an exemplary row process unit 1000-p implementing the layered decoding process 900. The row process unit 1000-p is substantially similar to the row process unit 700-p of FIG. 7B except the distinctions described below. As illustrated in FIG. 10, for a particular p$^{th}$ row of the b$^{th}$ layer, signals 714-1 through 714-L including row update values row_upd_vnode$_{1,p}^b$ through row_upd_vnode$_{L,p}^b$ respectively are sent to sub-row process units 1002-1 through 1002-L respectively.

In some embodiments, the sub-row process units 1002-1 through 1002-L may determine whether to compute layer_upd_vnode$_{l,p}^b$ based on the value of w(vnode$_{l,p}^b$), where l=1, . . . , L. In an example, for a variable node v$_{l1,p}^b$, the sub-row process unit 1002-l1 of the row process unit 1000-p determines that w(vnode$_{l1,p}^b$) is equal to one. In that example, the sub-row process unit 1002-l1 may then compute LLR value for vnode$_{l1,p}^b$ using the row update value row_upd_vnode$_{l1,p}^b$ (e.g., according to lines 13 to 15 of the layered decoding process 900 of FIG. 9). In another example, the sub-row process unit 1002-l2 of the row process unit 1000-p determines that w(vnode$_{l2,p}^b$) is not equal to one (e.g., w(vnode$_{l2,p}^b$) has a value between 2 and P). In that example, the sub-row process unit 1002-l2 sends a signal 1006-l2 including the row update value row_upd_vnode$_{l2,p}^b$ to an accumulation unit 1004. The accumulation unit 1004 may include one or more storage elements (e.g., flip-flops, shift registers, memory elements, etc.) that may be used to store the row update value row_upd_vnode$_{l2,p}^b$. As discussed in detail below with reference to FIG. 11, the v$_{l2,p}^b$ may be determined by a layer update unit in a subsequent step after multiple row update values (e.g., v$_{l2,p1}^b$ and v$_{l2,p2}^b$) for v$_b$', from multiple row process units (e.g., row process units 1000-p1 and 1000-p2) are generated in parallel and then stored in the accumulation unit 1004.

In some embodiments, a row process unit 1000-p may send row update values for variable nodes (e.g., row_upd_vnode$_{l2,p}^b$ having a weight greater than one to the accumulation unit 1004, but may not send row update values for variable nodes (e.g., row_upd_vnode$_{l1,p}^b$) having a weight equal to one to the accumulation unit 1004. As such, a reduction in storage usages for the accumulation unit 1004 may be achieved.

Alternatively, in some embodiments, the row update unit 1000-p (including the sub-row process units 1002-1 through 1002-L) may not compute LLR values for any variable nodes regardless of their weights. Instead, the sub-row process units 1002-1 through 1002-L may send row update values row_upd_vnode$_{1,p}^b$ through row_upd_vnode$_{L,p}^b$ to the accumulation unit 1004 regardless of whether the corresponding w(v$_l$) is equal to one. In those embodiments, the storage elements of the accumulation unit 1004 may store the row update values row_upd_vnode$_{1,p}^b$ through row_upd_vnode$_{L,p}^b$, where p=1, . . . , P. A layer update unit coupled to the accumulation unit 1004 may then determine layer_upd_vnode$_b$' in a subsequent step using the stored row update values row_upd_vnode$_{1,p}^b$ through row_upd_vnode$_{L,p}^b$, where p=1, . . . , P.

Figure 11:
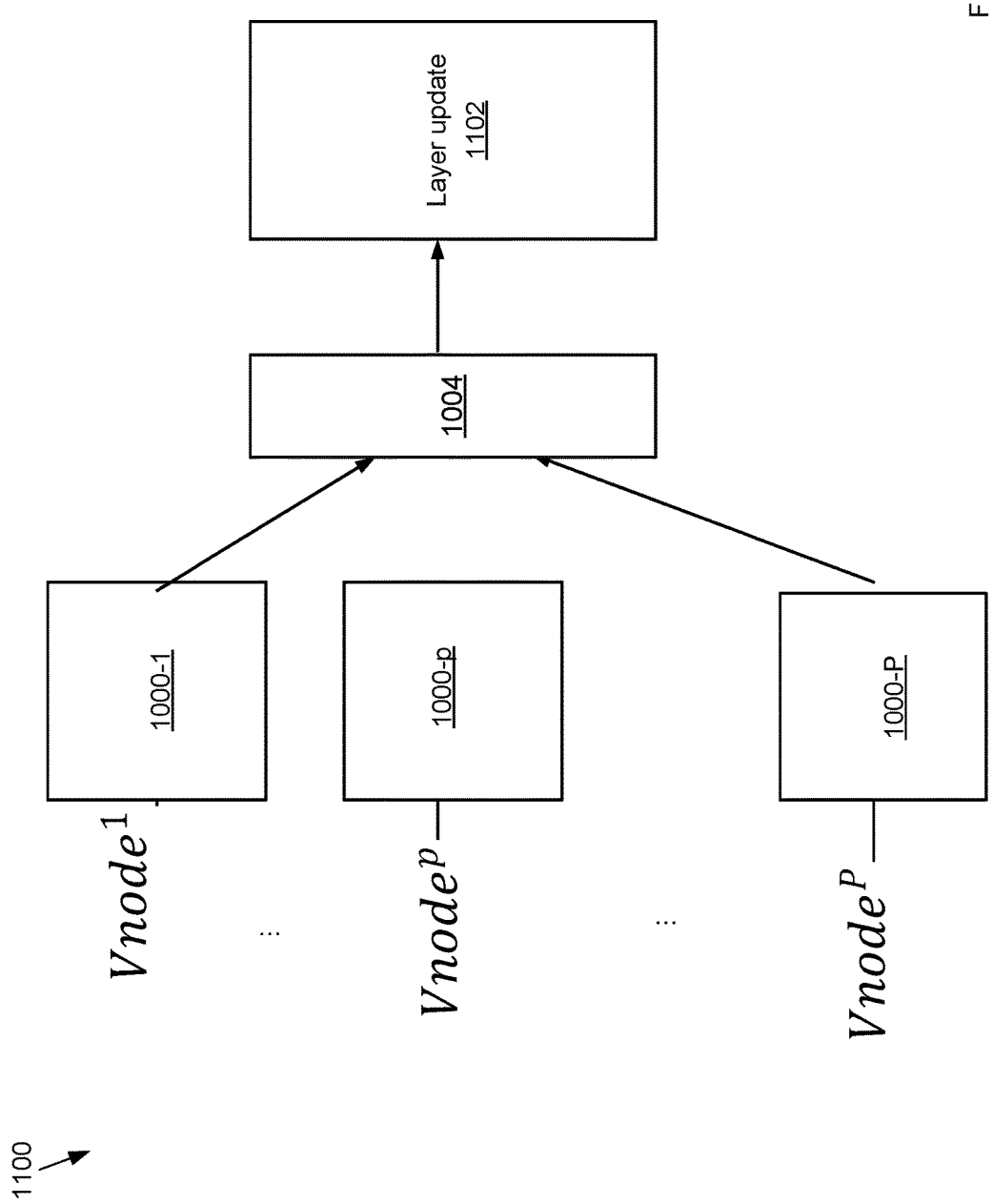
FIG. 11 illustrates another exemplary layer process unit according to some embodiments of the present disclosure.

Referring to FIG. 11, illustrated is a layer processing unit 1100 for a particular b$^{th}$ layer of the parity check matrix H, which may correspond to the b$^{th}$ row of the base matrix H$_B$. The elements of the b$^{th}$ row of the base matrix H$_B$ may correspond to a submatrix that includes P rows and has a circulant weight greater than one. As such, the b$^{th}$ layer includes the P rows of the parity check matrix H corresponding to the submatrix.

As shown in FIG. 11, in the layer processing unit 1100, by using an accumulation unit 1004 that may store row update values row_upd_vnode$_{l,p}^b$ P consecutive rows of a particular layer may be processed in parallel when processing a layer in a layered decoding process, even for QC-LDPC codes that have submatrices with a circulant weight greater than one. The layer processing unit 1100 includes a layer update unit 1102 coupled to the accumulation unit 1004, and the layer update unit 1102 may then then generate perform a layer update based on the stored row update values.

As illustrated in the example of FIG. 11, the layer processing unit 1100 includes row process units 1000-1 through 1000-P, where each row process unit may include one or more processors. The row process units 1000-1 through 1000-P may process variable nodes sets Vnode$^1$ through Vnode$^P$ respectively, where Vnode$^p$ includes variable nodes vnode$_{1,p}^b$ through vnode$_{L,p}^b$. The row process units 1000-1 through 1000-P may process the P rows simultaneously in parallel to generate the corresponding row update value sets row_update_Vnode$^1$ through row_update_Vnode$^P$, the row update value sets row_update_Vnode$^p$ denoting the set of row_upd_vnode$_{l,p}^b$.

In an example, a variable node participates in the p1$^{th}$ and p2$^{th}$ rows of the P rows of the parity check matrix H, and may be updated as vnode$_{l,p1}^b$ and vnode$_{l,p2}^b$ at the p1$^{th}$ and p2$^{th}$ rows of the P rows of the parity check matrix H respectively. As such, the row update value sets row_update_Vnode$^{p1}$ and row_update_Vnode$^{p2}$ from the row processing units 1000-p1 and 1000-p2 include row_upd_vnode$_{l,p1}^b$ and row_upd_vnod$_{l,p2}^b$ respectively, while the other row update value sets do not include any row update value for the variable node vnode$_l$.

In embodiments where only row update values for variable nodes having w(vnode$_l$) greater than one are sent to the accumulation unit 1004, the row update value sets row_update_Vnode$^1$ through row_update_Vnode$^P$ may not include row update values for variable nodes that has a weight equal to one. As such, by storing only the row update values for variable nodes having a weight greater than one in the accumulation unit 1004, less memory is needed for storing the row update values in the accumulation unit 1004.

In some embodiments, after the row process units 1000-1 through 1000-P complete processing the P rows of a particular layer in parallel, row update value sets row_update_Vnode$^1$ through row_update_Vnode$^P$ are stored in the accumulation unit 1004. A layer update unit 1102 may retrieve the stored row update value sets row_update_Vnode$^1$ through row_update_Vnode$^P$ from the accumulation unit 1004. The layer update unit 1102 may generate layer_update_Vnode using those retrieved row updates row_update_Vnode$^1$ through row_update_Vnode$^P$ (e.g., according to line 13 of the layered decoding process 900). The layer update unit 1102 may then compute the LLR value for variable node vnode$_l$ using the layer_update_Vnode (e.g., according to line 14 of the layered decoding process 900).

In some embodiments, the layer update unit 1102 may generate a layer update value layer_upd_vnode$_b$' for a variable node vnode$_b$' based on two or more row update values (e.g., row_upd_vnode$_{l,p1}^b$ and row_upd_v$_{l,p2}^b$) from two or more row process units (e.g., row processing units 1000-p1 and 1000-p2).

In some embodiments, for a variable node vnode$_{l,p}^b$ that is updated once only (e.g., at p3th of the P rows) and has a weight w(vnode$_l$) equal to one, the corresponding LLR value is computed by the sub-row processing unit 1002-1 of the row process unit 1000-p3. Alternatively, in some embodiments, the corresponding LLR value is computed by the layer update unit 1102, where the layer update unit 1102 stores the row update values for all variable nodes generated for the b$^{th}$ layer regardless of the weights of the variable nodes.

Figure 12:
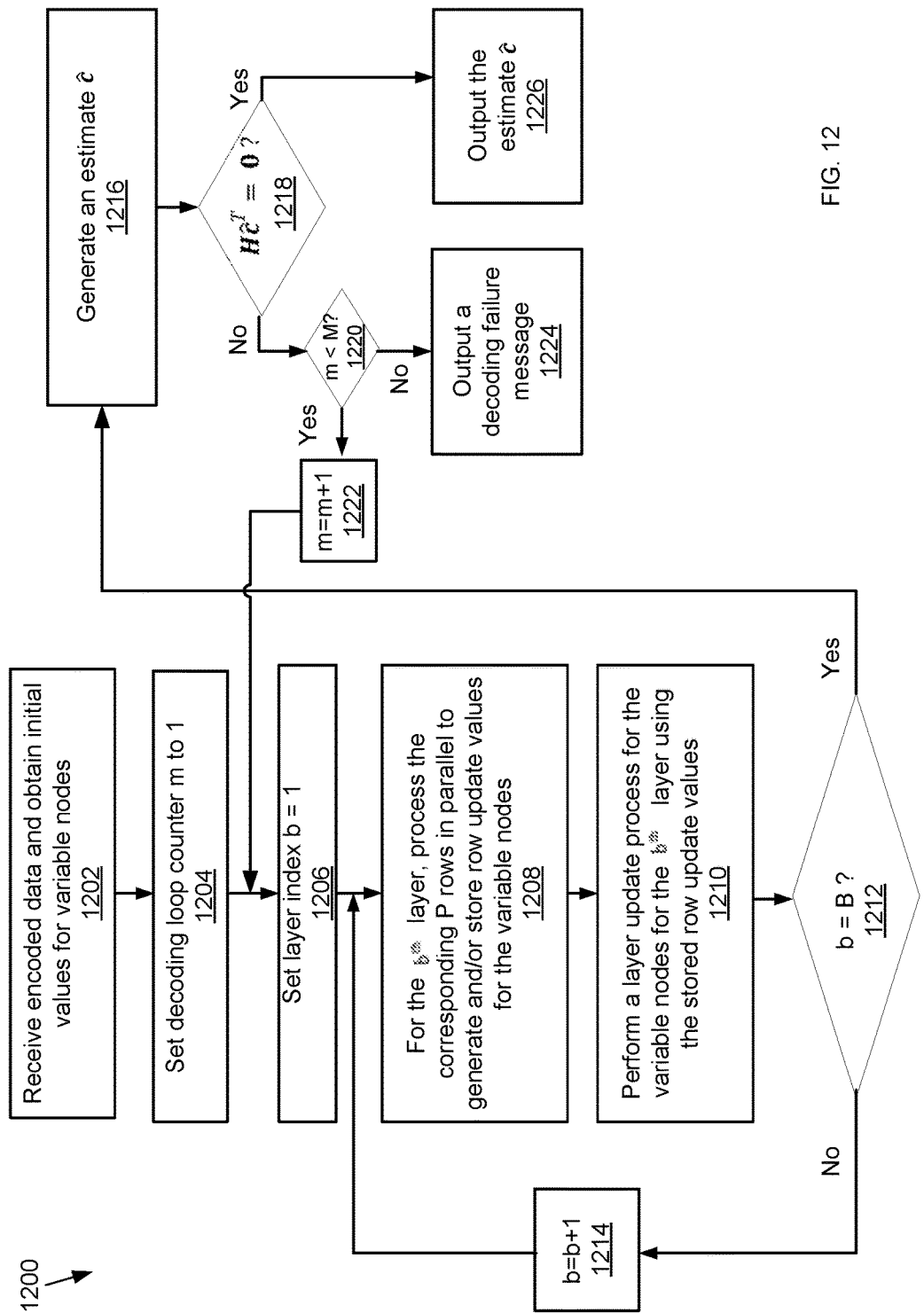
FIG. 12 illustrates an exemplary layered decoding method according to some embodiments of the present disclosure.

FIG. 12 shows a method 1200 of a layered decoding process with a parity check matrix H, where the parity check matrix H may be represented using a base matrix H$_B$ and corresponding submatrices with a circulant weight greater than one. The method 1200 begins at block 1202, where a decoder 208 may receive the encoded data, for example, a codeword through a channel 206. The decoder 208 may obtain soft information corresponding to the codeword. The soft information may correspond to a preliminary estimate of the codeword, LLRs associated with the codeword, or any other suitable information (e.g., channel reliability values) associated with the codeword. At block 1202, the decoder 208 may generate initial values for variable nodes for the received codeword based on the soft information.

The method 1200 may then proceed to perform one or more decoding iterations. At block 1204, the decoder 208 may initialize a decoding iteration counter m with a value of one.

The decoder 208 may then proceed to blocks 1206 through 1216 to perform the m$^{th}$ decoding iteration. Each decoding iteration goes through all rows of the base matrix H$_B$. Each row of the base matrix H$_B$ may correspond to a layer processed by the layered decoding process. At block 1206, the decoder 208 may initialize the layer index b with a value of one, which corresponds to the first row of the base matrix H$_B$.

The method 1200 may then proceed to block 1208, where the decoder 208 processes P consecutive rows of the parity check matrix H corresponding to the b$^{th}$ layer in parallel. For example, at block 1208, the P consecutive rows may be processed in parallel by the row process units 1000-1 through 1000-P of a layer process unit 1100 of FIG. 11. As shown in FIG. 11, at block 1208, the row process units 1000-1 through 1000-P may process variable node sets Vnode$^1$ through Vnode$^P$, and generate row updates row_update_Vnode$^1$ through row_update_Vnode$^P$, and store the row updates row_update_Vnode$^1$ through row_update_Vnode$^P$ (including row updates for the sets of vnode$_{l,p}$ with a weight w(vnode$_l$) greater than one, or row updates for all the vnode$_{l,p}$) in an accumulation unit 1004. In some embodiments, block 1208 implements lines 1 through 11 of the layered decoding process 900.

The method 1200 may then proceed to block 1210 to perform a layer update process using the row updates row_update_Vnode$^1$ through row_update_Vnode$^P$. In some embodiments, block 1210 implements lines 13 and 14 of the layered decoding process 900. In an example, at block 1210, a layer update unit 1102 of FIG. 11 may retrieve the row updates row_update_Vnode$^1$ through row_update_Vnode$^P$ from the accumulation unit 1004, and determine layer_update_Vnode using the retrieved row updates row_update_V$^1$ through row_update_V$^P$. The updated layer_update_Vnode including a set of layer_upd_vnode$_l$ that may be used be used in the next update of the layered decoding process. For a particular variable node vnode$_l$ having a weight w(vnode$_l$) greater than one, the layer update process at block 1210 may generate the corresponding layer_update_vnode$_l$ use multiple row update values. For example, at block 1208, a variable node vnode$_l$ having a weight of two is updated at both the p1$^{th}$ and p2$^{th}$ rows of the P consecutive rows of the b$^{th}$ layer. In that particular example, layer_upd_vnode$_l$ may be generated by combining row_upd_vnode$_{l,p1}$ and row_upd_vnode$_{l,p2}$. Alternatively, in some embodiments, a particular variable node v$_l$ has a weight equal to one, and is updated once at the p$^{th}$ row of the P consecutive rows. In those embodiments, layer_upd_vnode$_l$ may be the same as a single row update value row_upd_vnode$_{l,p}$.

The method 1200 may then proceed to block 1212 where the decoder 208 may check whether the current m$^{th}$ decoding iteration has reached the last row of the base matrix H$_B$. In some embodiments, after the decoder 208 determines that the layer index b is less than the number of rows B of the base matrix H$_B$, the method 1200 proceeds to block 1214 to increase the layer index b by one, and then proceeds to block 1208 to process the next layer of the layered decoding process.

In some embodiments, at block 1212, the decoder 208 determines that the layer index b equals to the base matrix row number B of the base matrix $H_B$. In those embodiments, the method 1200 may then proceed to block 1216, where the decoder 208 may determine an estimate $\hat{c}$ for the received codeword based on the updated LLR values (e.g., based on the signs of the LLR values) for the variable nodes.

The method 1200 may then proceed to block 1218 to determine whether the estimate $\hat{x}$ satisfies the syndrome condition $H\hat{c}^T=0$. If it is determined that the estimate $\hat{c}$ satisfies the syndrome condition, the method 1200 may proceed to block 1226, where the layered decoding process outputs the estimate $\hat{c}$ and stops. If it is determined that the estimate $\hat{c}$ does not satisfy the syndrome condition, the method 1200 checks whether it has reached the maximum number of decoding iterations M at block 1220. At block 1220, if it is determined that the iteration counter m is less than the maximum number M of decoding iterations, the method 1200 proceeds to block 1222 to increase the iteration counter m by one, and then proceeds to block 1206 to perform the next decoding iteration. If it is determined that the maximum number M of decoding iterations has been reached, then the method 1200 proceeds to block 1224 to provide a decoding failure message.

Figure 13:
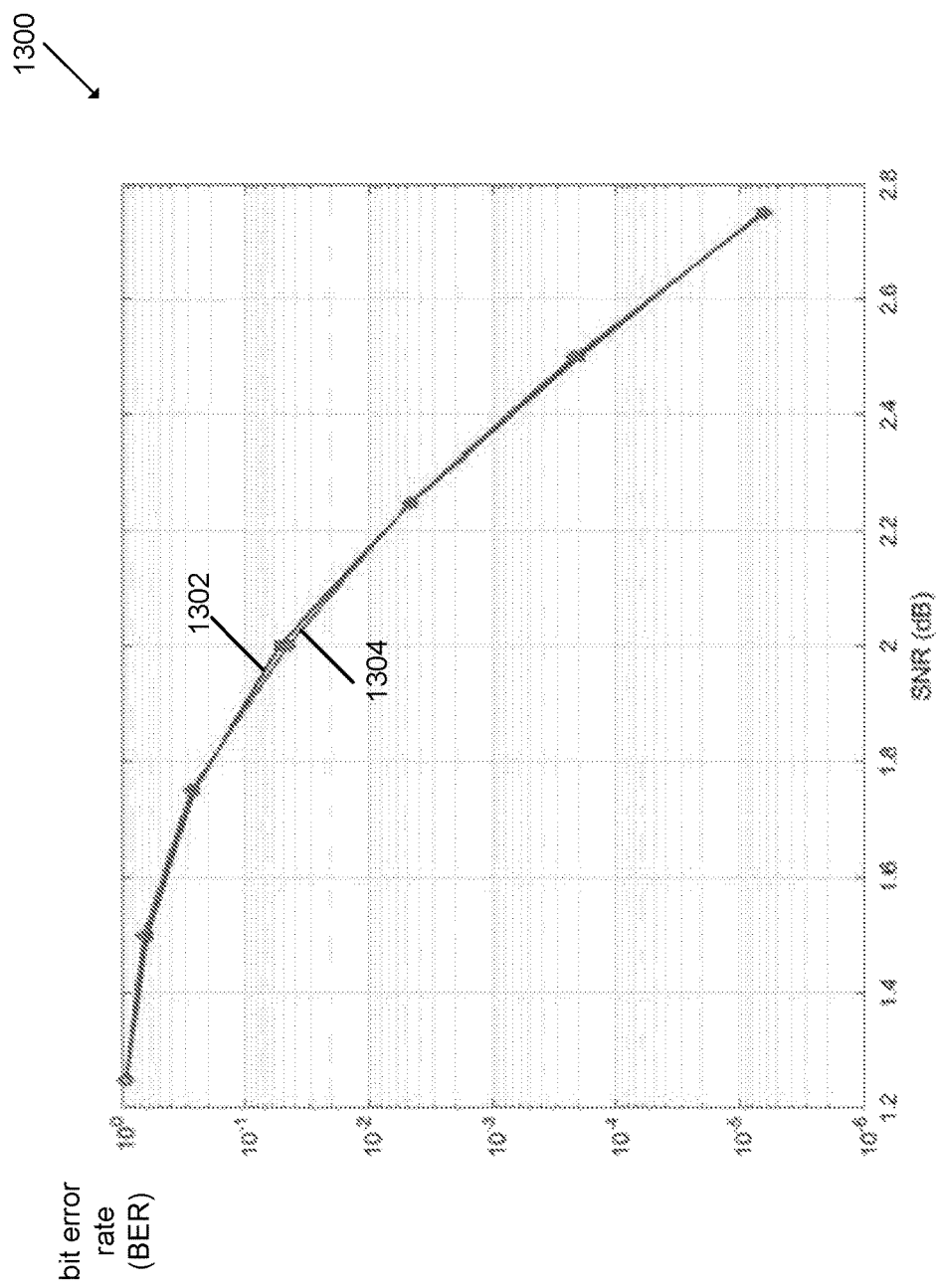
FIG. 13 illustrates performance comparison of various embodiments for decoding methods according to some embodiments of the present disclosure.

FIG. 13 illustrates performance comparison of various embodiments. FIG. 13 shows a bit error rate (BER) chart 1300 comprising an x-axis that corresponds to a signal-to-noise (SNR) ratio, a y-axis that corresponds to a bit error rate (BER), and BER curves 1302 and 1304. For generating FIG. 13, an encoding and/or decoding system 200 for a rate ½ QC-LDPC code having a length of 1296, P=81 and average circulant weight of 1.34 was used. In the encoding and/or decoding system 200, the encoder 204 receives message data 202, encodes the message data, and transmits the encoded message data to the decoder 208 through the channel 206. The decoder 208 then decodes the received encoded message data. In FIG. 13, the x-axis of the BER chart 1300 corresponds to an SNR of the transmission signal of the encoded message data between the encoder 204 and the decoder 208. The BER curve 1302 corresponds to a decoder 208 that does not implement parallel processing for the P rows of a layer in a layered decoding process. The BER curve 1304 corresponds to a decoder 208 including layer process units 1100 of FIG. 11 for processing the P rows of a layer in parallel. As illustrated in FIG. 13, the BER curves 1302 and 1304 are substantially the same where the SNR is between about 1.2 dB and about 2.8 dB.

It is noted that various configurations (e.g., the circulant weight and size of the submatrix, the scaled min-sum algorithm used in the extrinsic information unit 708) illustrated in FIGS. 2-13 are exemplary only and not intended to be limiting beyond what is specifically recited in the claims that follow. It will be understood by those skilled in that art that other configurations may be used. For example, the extrinsic information unit 708 may use different belief propagation algorithm including, for example, a sum-product algorithm and a min-sum algorithm. For further example, while in the example of FIG. 12 the estimate $\hat{c}$ is computed after the $m^{th}$ decoding iteration has reached the last row of the base matrix $H_B$, in alternative embodiments, the estimate $\hat{c}$ may be determined after each layer is processed (e.g., between block 1210 and block 1212). Yet in another example, the method 1200 may provide that the layered decoding process stops when it has reached a maximum layer number specifying the maximum number of layers that the layered decoding process may perform.

Various advantages may be present in various applications of the present disclosure. No particular advantage is required for all embodiments, and different embodiments may offer different advantages. One of the advantages in some embodiments is that for a particular layer including a submatrix having a circulant weight greater than one, parallel row processing for the rows of that particular layer is enabled despite the data dependencies between the rows. For example, in a particular layer, row processing units may process the rows in parallel by sending row update values for a variable node that particulates in those rows to a storage element. For further example, after the row processes are completed for that particular layer, a layer update unit may generate a layer update value for that variable node using the stored plurality of row update values for that variable node. This allows the decoder to process those rows of the layer in parallel, even for submatrices having a circulant weight greater than one. As such, decoding throughput is improved. Furthermore, such a decoding method enables hardware efficient implementation.

Further, compared to other decoding methods (e.g., a flooding type decoder, a submatrix splitting method) for decoding quasi-cyclic LDPC codes with a circulant weight greater than one, the layered decoding method 1200 scales better when the circulant weight of the submatrix increases, and improves throughput and latency without performance degradation (e.g., in bit error rate as shown in FIG. 13). For example, a submatrix splitting method implements the layered decoding method by splitting the submatrix into multiple subsets where each subset does not have dependencies between variable nodes, and rows in the subset may be processed in parallel. However, unlike the layered decoding method 1200, the submatrix splitting method does not scale well as the circulant weight increases, because the parallelism for each subset reduces drastically and may result in orders of magnitude reduction in throughput as the circulant weight of the submatrix increases. For further example, unlike the layered decoding method 1200, the flooding type decoder may result in a throughput reduction and latency increase (e.g., by a factor of two).

Although particular features have been shown and described, it will be understood that they are not intended to limit the claimed invention, and it will be made obvious to those skilled in the art that various changes and modifications may be made without departing from the spirit and scope of the claimed invention. The specification and drawings are, accordingly to be regarded in an illustrative rather than restrictive sense. The claimed invention is intended to cover all alternatives, modifications and equivalents.

What is claimed is:

1. A decoder circuit, comprising:
 an input configured to receive an encoded message generated based on a quasi-cyclic low-density parity check (QC-LDPC) code associated with a parity check matrix,
  wherein the parity check matrix is constructed by expanding a plurality of elements of a base matrix using a plurality of submatrices respectively,
   wherein a submatrix of the plurality of submatrices has a circulant weight greater than one;
 a layer process unit configured to process a plurality of layers of the parity check matrix respectively to generate a plurality of log-likelihood ratio ("LLR") values corresponding to a plurality of variable nodes associated with the encoded message, each layer including a plurality of rows of the parity check matrix,
wherein the layer process unit configured to process a first layer includes:
a plurality of row process units configured to process a first plurality of rows of the first layer in parallel to generate a plurality of row update values for the plurality of variable nodes; and
a layer update unit coupled to the plurality of row process units and configured to generate a first LLR value associated with a first variable node using first and second row update values for the first variable node; and
an output configured to provide a decoded message generated based on the plurality of LLR values.

2. The decoder circuit of claim 1, where the first layer corresponds to a row of the base matrix.

3. The decoder circuit of claim 2, where an element of the row of the base matrix is expanded with a submatrix having a circulant weight greater than one.

4. The decoder circuit of claim 1, wherein the layer process unit further includes a storage element configured to store the first row update value and the second row update value, and
wherein the layer update unit is configured to retrieve, from the storage element, the first and second row update values for generating the first LLR value.

5. The decoder circuit of claim 4, wherein a first row process unit of the plurality of row process units includes:
a first sub-row process unit configured to:
receive the first row update value corresponding to the first variable node; and
determine that the first variable node is updated two or more times in the first plurality of rows and in response, send the first row update value to the storage element.

6. The decoder circuit of claim 5, wherein the first row process unit of the plurality of row process units includes:
a second sub-row process unit configured to:
receive a third row update value corresponding to a second variable node; and
determine that the second variable node is updated once in the first plurality of rows and in response, generate a second LLR value for the second variable node using the third row update value.

7. The decoder circuit of claim 5, wherein the first row process unit of the plurality of row process units is configured to send a third row update value corresponding to a second variable node to the storage element,
wherein the second variable node is updated once in the first plurality of rows, and
wherein the layer update unit is configured to retrieve, from the storage element, the third row update value and generate a second LLR value for the second variable node using the third row update value.

8. The decoder circuit of claim 1, wherein the layer process unit is configured to:
after processing the first layer of the parity check matrix, processing a second layer of the parity check matrix adjacent to the first layer to update the variable nodes, wherein the plurality of row process units of the layer process unit are configured to process a second plurality of rows corresponding to the second layer in parallel to generate a second plurality of row update values for the variable nodes.

9. The decoder circuit of claim 1, wherein each row process unit is configured to generate the first plurality of row update values using a belief propagation algorithm.

10. The decoder circuit of claim 9, wherein the belief propagation algorithm includes a sum-product algorithm, a min-sum algorithm, a scaled min-sum algorithm, or a variable scaled min-sum algorithm.

11. A method, comprising:
receiving an encoded message generated based on a quasi-cyclic low-density parity check (QC-LDPC) code associated with a parity check matrix,
wherein the parity check matrix is constructed by expanding a plurality of elements of a base matrix using a plurality of submatrices respectively,
wherein a submatrix of the plurality of submatrices has a circulant weight greater than one;
processing, by a layer process unit, a plurality of layers of the parity check matrix to generate a plurality of LLR values for a plurality of variable nodes associated with the encoded message,
wherein the processing, by the layer process unit, a first layer includes:
processing, by a plurality of row process units of the layer process unit, a first plurality of rows of the first layer in parallel, to generate a first plurality of row update values for the plurality of variable nodes; and
generating, by a layer update unit of the layer process unit, a first LLR value for a first variable node using a first row update value corresponding to a first row of the parity check matrix and a second row update value corresponding to a second row of the parity check matrix; and
generating a decoded message based on the plurality LLR values.

12. The method of claim 11, where the first layer corresponds to a row of the base matrix.

13. The method of claim 12, wherein an element of the row of the base matrix is expanded with a submatrix having a circulant weight greater than one.

14. The method of claim 11, wherein the processing the first layer further includes:
storing, in a storage element, the first row update value and the second row update value; and
retrieving, by the layer update unit from the storage element, the first and second row update values for generating the first LLR value.

15. The method of claim 14, wherein the processing the first layer further includes:
generating, by the first row process unit of the plurality of row process units, the first row update value corresponding to the first variable node;
determining, by the first row process unit, that the first variable node is updated two or more times in the first plurality of rows; and
storing, in the storage element, the first row update value.

16. The method of claim 15, wherein the processing the first layer further includes:
generating, by the first row process unit, a third row update value corresponding to a second variable node, wherein the second variable node is updated once in the first plurality of rows; and
generating, by the first row process unit, a second LLR value for the second variable node using the third row update value.

17. The method of claim 16, wherein the processing the first layer further includes:

generating, by the first row process unit, a third row update value corresponding to a second variable node, wherein the second variable node is updated once in the first plurality of rows;

storing, in the storage element, the third row update value;

retrieving, by the layer update unit from the storage element, the third row update value; and generating, by the layer update unit, the second LLR value for the second variable node using the third row update value.

18. The method of claim 11, further comprising:
after processing the first layer of the parity check matrix, processing a second layer of the parity check matrix adjacent to the first layer to update the variable nodes, wherein a second plurality of rows corresponding to the second layer are processed in parallel to generate a second plurality of row update values for the plurality of variable nodes.

19. The method of claim 11, wherein the first plurality of row update values are generated using a belief propagation algorithm.

20. The method of claim 19, wherein the belief propagation algorithm is selected from the group consisting of a sum-product algorithm, a min-sum algorithm, a scaled min-sum algorithm, and a variable scaled min-sum algorithm.

* * * * *